United States Patent
Srinivasan et al.

(10) Patent No.: US 12,424,443 B2
(45) Date of Patent: Sep. 23, 2025

(54) FIN FIELD-EFFECT TRANSISTOR SEMICONDUCTOR DEVICE AND METHOD OF FORMING THE SAME

(71) Applicant: Texas Instruments Incorporated, Dallas, TX (US)

(72) Inventors: Bhaskar Srinivasan, Allen, TX (US); Walter Scott Idol, Plano, TX (US); Ming-Yeh Chuang, McKinney, TX (US); Brian Goodlin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 687 days.

(21) Appl. No.: 17/545,209

(22) Filed: Dec. 8, 2021

(65) Prior Publication Data

US 2023/0178372 A1    Jun. 8, 2023

(51) Int. Cl.
*H01L 21/225* (2006.01)
*H10D 30/01* (2025.01)

(52) U.S. Cl.
CPC ....... *H01L 21/2251* (2013.01); *H10D 30/024* (2025.01); *H10D 30/0281* (2025.01)

(58) Field of Classification Search
CPC ............ H01L 21/2251; H01L 21/2256; H01L 29/66681; H01L 29/66795; H01L 29/0878; H01L 29/1095; H01L 29/7816; H01L 29/66803; H01L 29/785; H10D 30/024; H10D 30/0281; H10D 30/65; H10D 30/0241; H10D 30/62; H10D 62/157; H10D 62/393

See application file for complete search history.

(56) References Cited

U.S. PATENT DOCUMENTS

| | | | |
|---|---|---|---|
| 7,994,013 B2 * | 8/2011 | Yoo | H01L 29/66689 438/296 |
| 8,872,220 B2 | 10/2014 | Xiong et al. | |
| 9,691,751 B2 * | 6/2017 | Srinivasan | H01L 29/0649 |
| 2016/0315191 A1 * | 10/2016 | Tsai | H01L 27/0924 |
| 2017/0103917 A1 * | 4/2017 | Cai | H01L 29/66515 |

OTHER PUBLICATIONS

U.S. Appl. No. 17/462,801, filed Aug. 31, 2021 entitled "Implant Blocking for a Trench or FinFET without an Additional Mask".
U.S. Appl. No. 17/458,122, filed Aug. 26, 2021 entitled "A Fin Field-Effect Transistor (FinFET) with a High-K Material Field".

* cited by examiner

*Primary Examiner* — Dale E Page
*Assistant Examiner* — Quovaunda Jefferson
(74) *Attorney, Agent, or Firm* — Andrew R. Ralston; Frank D. Cimino

(57) ABSTRACT

A fin field-effect transistor ("FinFET") semiconductor device and method of forming the same. In one example, a semiconductor fin is formed over a semiconductor substrate. A conformal dielectric layer is formed on a top and side surfaces of the fin. A doped semiconductor layer is formed over the conformal dielectric layer, the doped semiconductor layer including a dopant. The doped semiconductor layer is heated thereby driving the dopant through the conformal dielectric layer and forming a doped region of the fin.

17 Claims, 9 Drawing Sheets

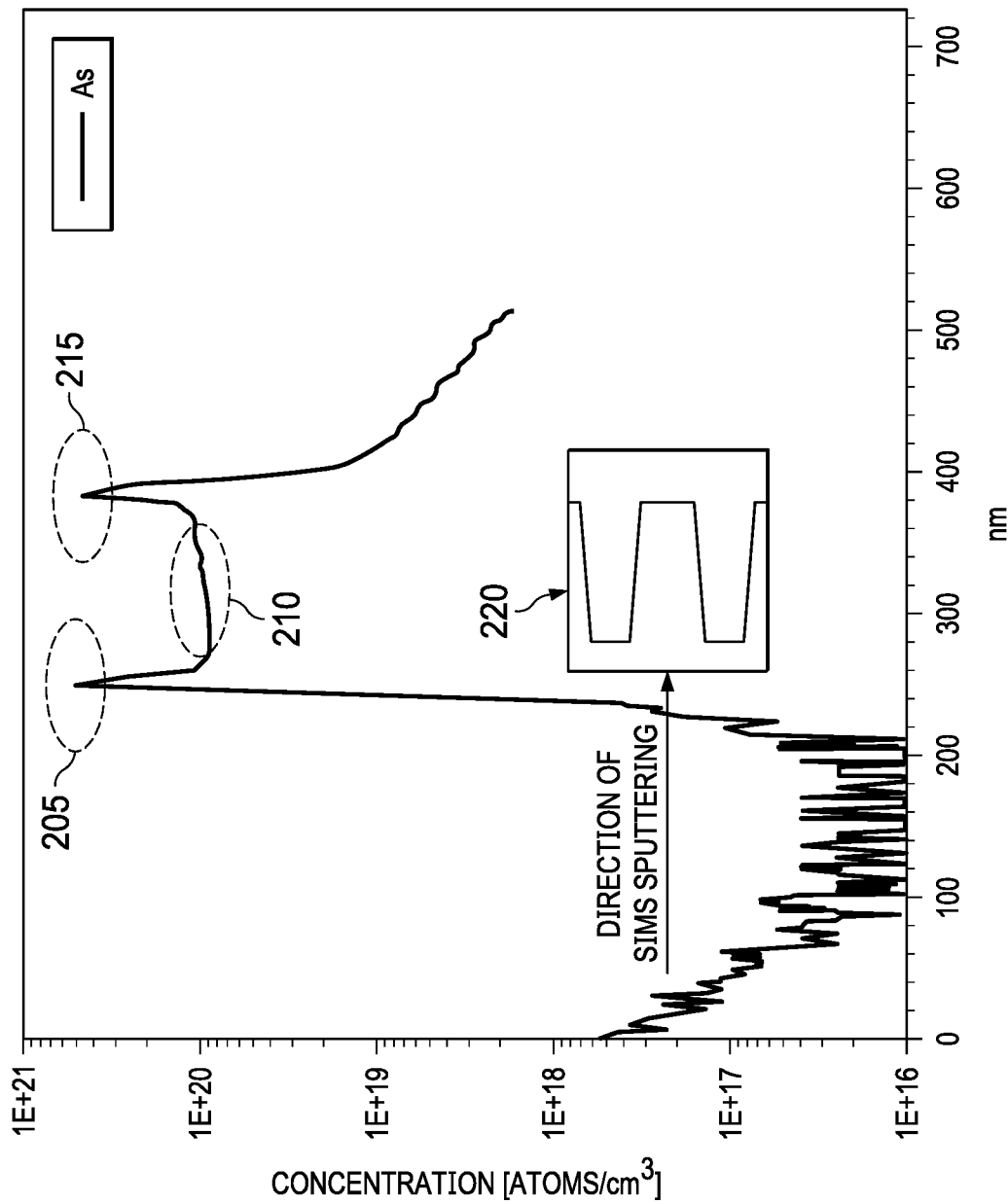

FIN FIELD-EFFECT TRANSISTOR SEMICONDUCTOR DEVICE AND METHOD OF FORMING THE SAME

TECHNICAL FIELD

The present disclosure relates to the field of semiconductor devices and, more particularly, but not exclusively, to an apparatus and method to uniformly dope semiconductor fins of a fin field-effect transistor ("FinFET") semiconductor device.

BACKGROUND

With the continuing trend in the semiconductor industry towards scaling down the size of metal-oxide semiconductor ("MOS") transistors, three-dimensional or non-planar transistor technology such as a fin field-effect transistor ("FinFET") has been and continues to be developed to replace planar MOS transistors in some applications. Since the three-dimensional structure of a FinFET increases an overlapping area between the gate and the fin-shaped structure formed on the silicon substrate, the switchable channel region can be more effectively controlled. The channel region is also longer for an equivalent gate length, and thus the on-resistance of the channel between the source and the drain may be decreased. In addition, the threshold voltage of the FinFET can be controlled by adjusting the work function of the gate.

Traditional doping methods such as beamline implants and plasma doping ("PLAD") or ion implantation implant result in a dopant with a non-uniform doping density at different faces of the fins in a FinFET. As a result, a non-uniform doping density in the drain drift region ("NDRIFT") arises that may result in a premature break-down voltage ("BVD") at a fin top. Non-uniform doping density in the N-doped DWELL region may result in multiple levels of threshold voltage ("Vt") for the FinFET and, generally, a lower linear-region drain saturation current ("Idlin") for three-dimensional analog devices. Furthermore, even using a four-rotation beamline implant in a FinFET fin, which may reduce doping variation in other contexts, still may result in an unacceptable non-uniform dopant distribution along fins from the top down into the trench.

The problems of premature break-down voltage at a fin top and non-uniform levels of threshold voltage produced by non-uniform doping density are inherent in design and formation processes for silicon MOS field-effect transistor devices, including FinFETs. Thus, current processes for fabricating FinFETs are insufficient for producing semiconductor devices with performance levels acceptable for current applications. Accordingly, what is needed is a semiconductor device and related method of forming the same that addresses non-uniform dopant distribution along fins of a FinFET semiconductor device.

SUMMARY

These and other problems are generally solved or circumvented, and technical advantages are generally achieved, by advantageous examples of the present disclosure which includes a fin field-effect transistor ("FinFET") semiconductor device, and method of forming the same. In one example, a semiconductor fin is formed over a semiconductor substrate. A conformal dielectric layer is formed on a top and side surfaces of the fin. A doped semiconductor layer is formed over the conformal dielectric layer, the doped semiconductor layer including a dopant. The doped semiconductor layer is heated thereby driving the dopant through the conformal dielectric layer and forming a doped region of the fin. While such examples may be expected to provide improvements in performance, such as improved linearity and more uniform breakdown voltage of a FinFET transistor, no particular result is a requirement of the present invention unless explicitly recited in a particular claim.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which:

FIG. 2 illustrates a graphical representation demonstrating a non-uniform dopant profile resulting applying a plasma doping ("PLAD") method to the fin field-effect transistor ("FinFET") semiconductor device;

Corresponding numerals and symbols in the different FIGUREs generally refer to corresponding parts unless otherwise indicated, and may not be redescribed in the interest of brevity after the first instance. The FIGUREs are drawn to illustrate the relevant aspects of exemplary examples.

DETAILED DESCRIPTION

The making and using of the examples are discussed in detail below. It should be appreciated, however, that the present disclosure provides many applicable concepts that can be embodied in a wide variety of specific contexts. The specific examples discussed are merely illustrative of specific ways to make and use the disclosure, and do not limit the scope of the disclosure.

The present disclosure will be described with respect to examples in a specific context, namely, a fin field-effect transistor ("FinFET") semiconductor device, and method of forming the same. The principles of the present disclosure, however, may also be applied to all types of semiconductor devices that may benefit from a more uniform dopant distribution along fins of a FinFET semiconductor device, or other semiconductor device.

For a better understanding of FinFET semiconductor devices, see U.S. Pat. No. 8,872,220, issued Oct. 28, 2014, incorporated herein by reference in its entirety. See also, U.S. patent application Ser. No. 17/462,801, filed Aug. 31, 2021 and U.S. patent application Ser. No. 17/458,122, filed Aug. 26, 2021, each of which is incorporated herein by reference in its entirety.

The FinFET is a type of non-planar transistor, or three-dimensional ("3-D") transistor. A FinFET semiconductor device may contain a plurality of fins, arranged side-by-side and all covered by a gate, which act electrically as one to provide a desired drive strength and performance. In such FinFETs, the width of the channel may include portions oriented in or near a vertical direction, that is, in a direction perpendicular to the major surface of the substrate, while the length of the channel is oriented parallel to the major surface of the substrate, along the long axis of the fins. With such orientation of the channel, FinFETs can be constructed to have a larger width conduction channel for a given two-dimensional ("2-D") die area than a corresponding planar FET so as to produce larger current drive and a lower on-resistance than planar metal-oxide semiconductor field-effect transistors ("MOSFETs") that occupy the same amount of die area (the area parallel to the major surface of the substrate), or to produce a similar current drive and on-resistance as the corresponding transistor while occupying a smaller die area.

Figure 1A:
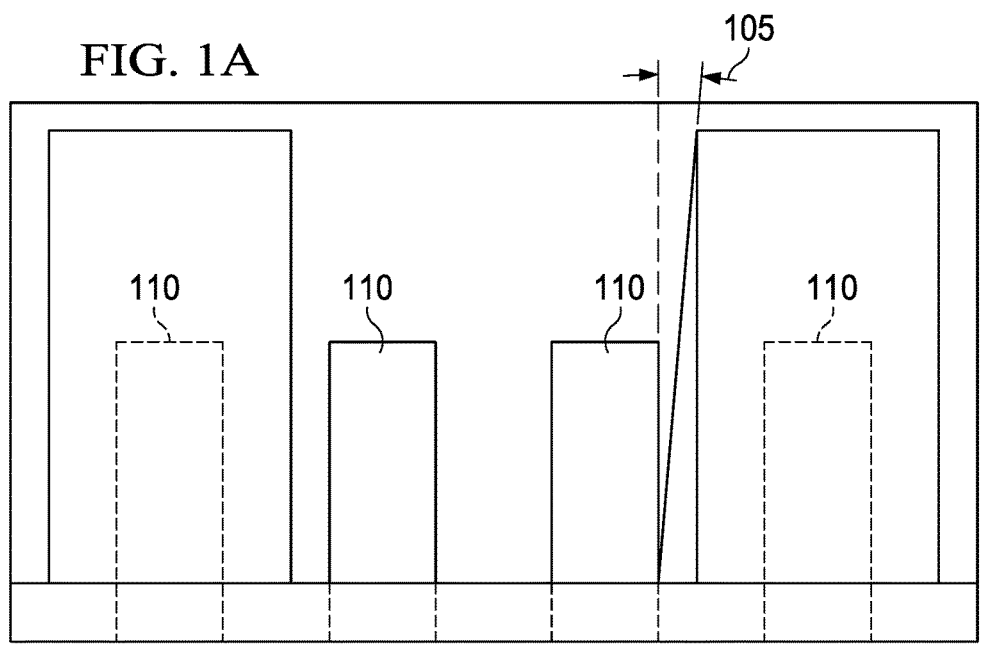
FIG. 1A illustrates a diagram of a baseline beamline implantation with an implant angle.
Figure 1B:
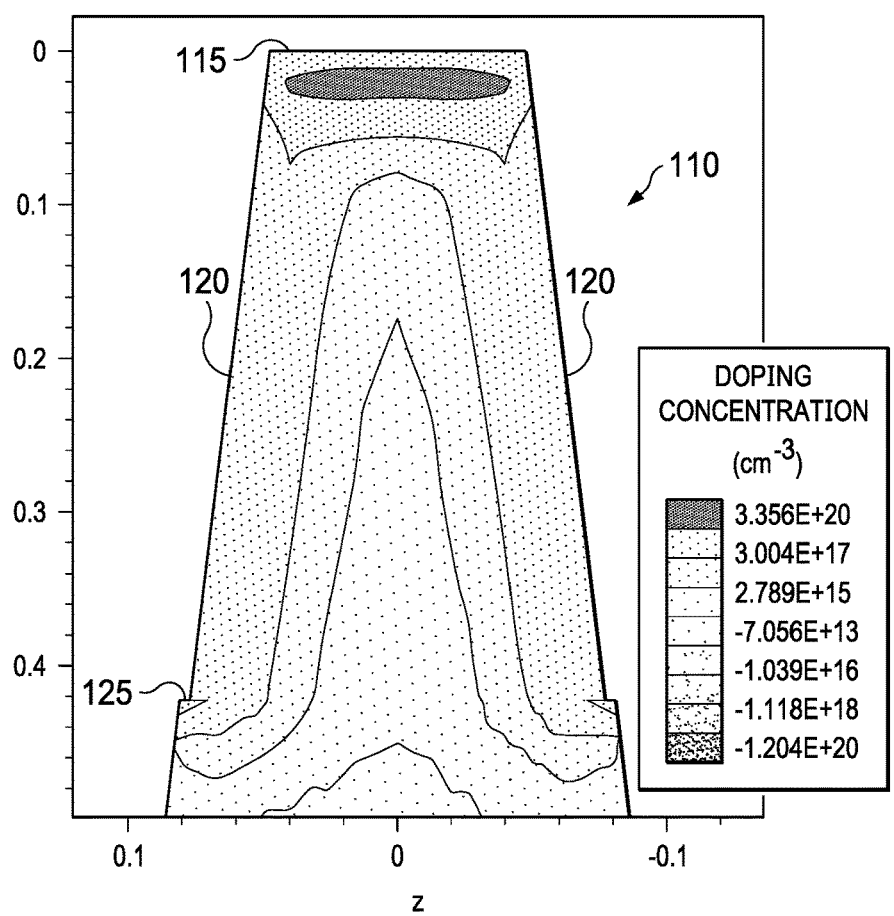
FIG. 1B illustrates a graphical representation demonstrating a non-uniform dopant profile resulting from the baseline beamline implantation.

Referring initially to FIG. 1A, illustrated is a diagram of a fin 110 of an example baseline FinFET for which dopants are implanted into the fin using a beamline with an implant angle 105 generally less than 20°. FIG. 1B shows a graphical representation of a resulting dopant profile demonstrating nonuniformity resulting therefrom. Due to the presence of the implant angle 105, a shadowing effect may be created during implantation and as a result the dopant density may vary from a higher value at a top surface 115 of the fin 110 to a lower value along sidewalls 120 down into a trench 125. The doping variation may include a ratio of high-to-low value of 3:1 from the top surface 115 to the sidewalls 120 down into the trench 125.

In some cases, a baseline beamline implant uses a four-rotation implant technique. In this example, the dopant may be an N-type dopant (e.g., phosphorous) implanted with an energy of 15 keV at an angle of 10° relative to the normal to the planar surface of the underlying substrate, or wafer. As illustrated, the top surface 115 of the fin 110 has received a larger dose of dopants than the sidewalls 120 of the fin 110, e.g., about $4e17$ $cm^{-3}$ at the top surface 115 as compared to about $4e16$ $cm^{-3}$ at the sidewalls 120, approximately an order of magnitude difference. In this example, the top surface 115 will receive dopants during each of the four angled implant rotations, while the sidewalls 120 will typically only receive dopants during one of the rotations.

The increased dopant in regions at the top surface 115 of the fin 110 relative to regions at the sidewalls 120 of the fin 110 may reduce the breakdown voltage of the FinFET. This line-of-sight shadowing effect with angular limitations makes it difficult to uniformly dope a non-planar structure like a FinFET. This also may cause significant variations in device parameters affecting its reliable performance. In particular, if a lightly-doped-drain region of a drain exten-sion is largely not uniformly doped, a correspondingly large variation in the reverse breakdown voltage will exist throughout that region leading to some portions having a lower breakdown voltage than other portions. This will result in a reduction in the rated breakdown voltage of the FinFET semiconductor device.

An alternate method used to implant dopants into semiconductor wafers is plasma doping ("PLAD") in which dopant ions are extracted and deposited onto the wafer surface from a plasma cloud in a chamber using an acceleration voltage bias applied to the wafer. The PLAD method can provide higher dose rates at lower energy levels than the baseline beamline ion implant method.

Turning now to FIG. 2, illustrated is a graphical representation demonstrating a non-uniform dopant profile resulting applying a PLAD method to the FinFET semiconductor device. After completing deposition, a fin is analyzed using a one and half dimensional ("1.5D") secondary ion mass spectrometry ("SIMS") to determine the resulting doping profile at the top surface 205, sidewalls 210 and bottom trench 215 of the fin. The measuring beam is sputtered in a perpendicular direction to the top surface 205 as shown in sub-image 220. The measurements show that the dopant level (arsenic in this case) is $5e20$ $cm^{-3}$ at the top surface 205 of the fin then drops to $1e20$ $cm^{-3}$ along the entire length of the sidewall 210 of the fin traversing to the bottom trench 215 where it once again rises to $5e20$ $cm^{-3}$. A large non-uniformity of 5:1 is observed which will result in pre-mature breakdown voltages at certain points of the fin well before others resulting in an unacceptable performance degradation of the resulting FinFET semiconductor device.

Figure 3A:
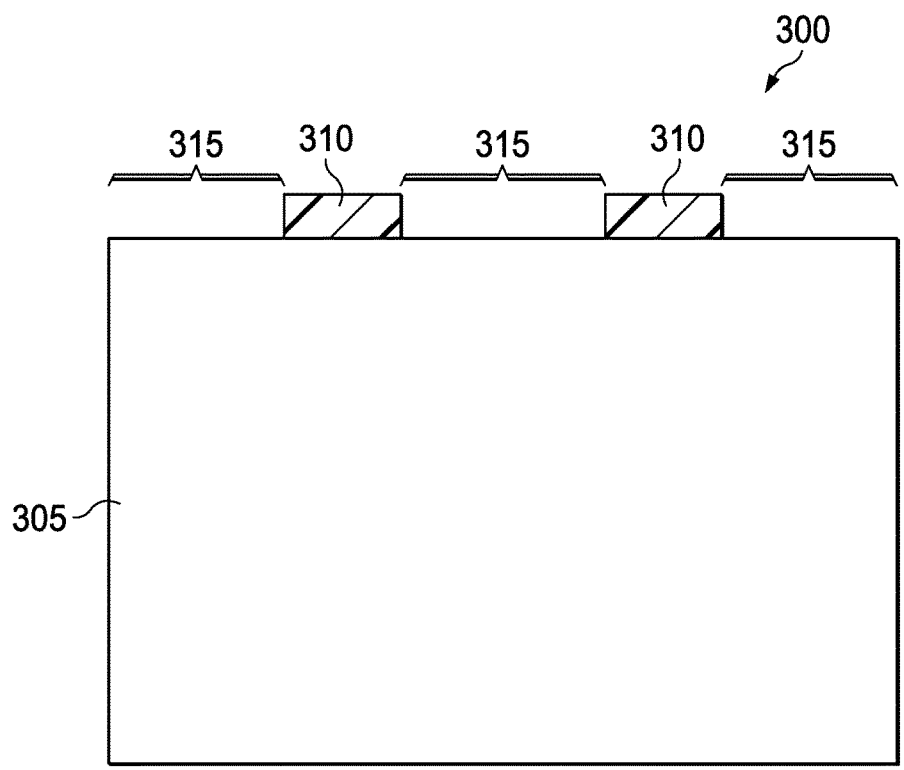
FIGS. 3A through 3D illustrate various views of an integrated circuit ("IC") at several stages during the fabrication of a FinFET semiconductor device.
Figure 3B:
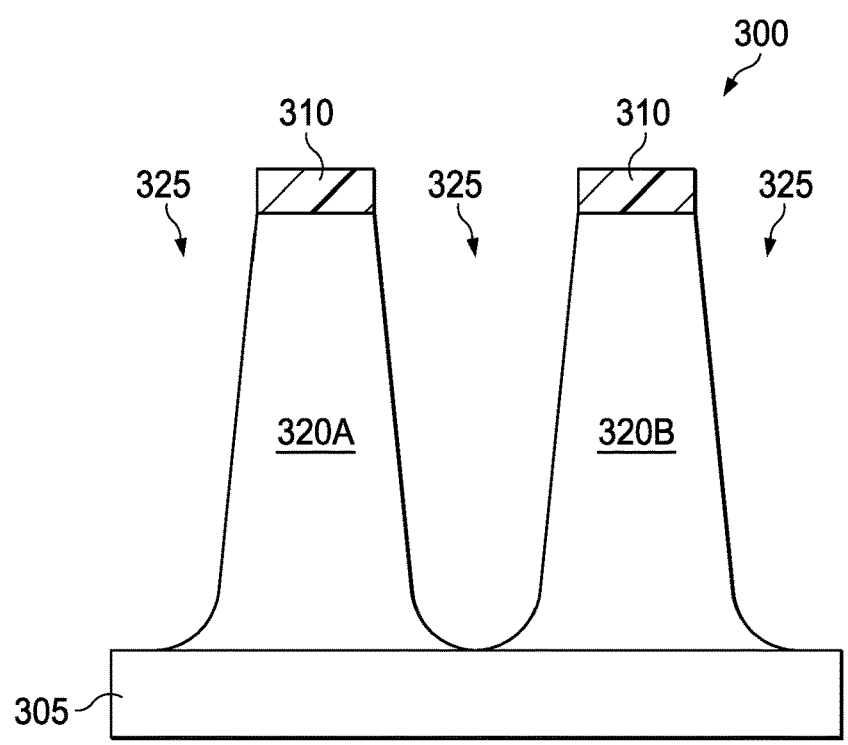

Turning now to FIGS. 3A through 3D, illustrated are various views of an integrated circuit ("IC") 300 at several stages during the fabrication of a FinFET semiconductor device. In FIG. 3A, a cross-sectional view of a substrate 305 is shown. The substrate 305 may be a bulk semiconductor such as silicon, silicon on insulator ("SOI"), silicon-germanium, gallium arsenide, etc. In one example, a reduced surface field ("RESURF") layer (not specifically shown) is formed on the oxide layer of an SOI substrate. In another example, an N-type layer is formed in a bulk silicon substrate and a RESURF layer is formed on the N-type layer. In some implementations, an epitaxial layer (not specifically shown), which may be monocrystalline silicon, is grown on or over the substrate 305, with buried and/or well layers formed before or after forming the epitaxial layer, as appropriate to the layer type. For the purpose of this discussion, the substrate 305 may include any such modifications without further elaboration.

Hardmasks (also spelled hard masks) used in lithography processes play a role in pattern transfer to a desired substrate. Depending on the substrate to be etched, the materials used as hardmasks exhibit etch resistance to either oxygen rich plasma or halogen rich plasma, as well as good wet removability and fill capability in high aspect ratio contacts and trenches. Silicon nitride and silicon oxide are typical hardmask materials used to etch silicon.

In the example illustrated in FIG. 3A, a hardmask layer has been deposited and patterned to form a patterned hardmask 310 that exposes regions 315 of the substrate 305 in which trenches are to be formed. In one implementation the patterned hardmask 310 is formed of silicon nitride, although other hardmask materials may also be used. The substrate 305 is then etched at exposed regions 315 to form a first semiconductor fin 320A and a second semiconductor fin 320B over the substrate 305 and underneath the patterned hardmask 310, with trenches 325 formed between the semiconductor fins 320A, 320B, as shown in a cross-section in FIG. 3B.

Although only one or two semiconductor fins 320A, 320B are specifically shown in each of the present figures, a FinFET may have a substantial number of additional semiconductor fins that are controlled by a same gate. The etch process may be similar to the process that is used to etch silicon for shallow trench isolation ("STI") and is not further elaborated. At this point in the baseline processing, the patterned hardmask 310 is removed.

Figure 3C:
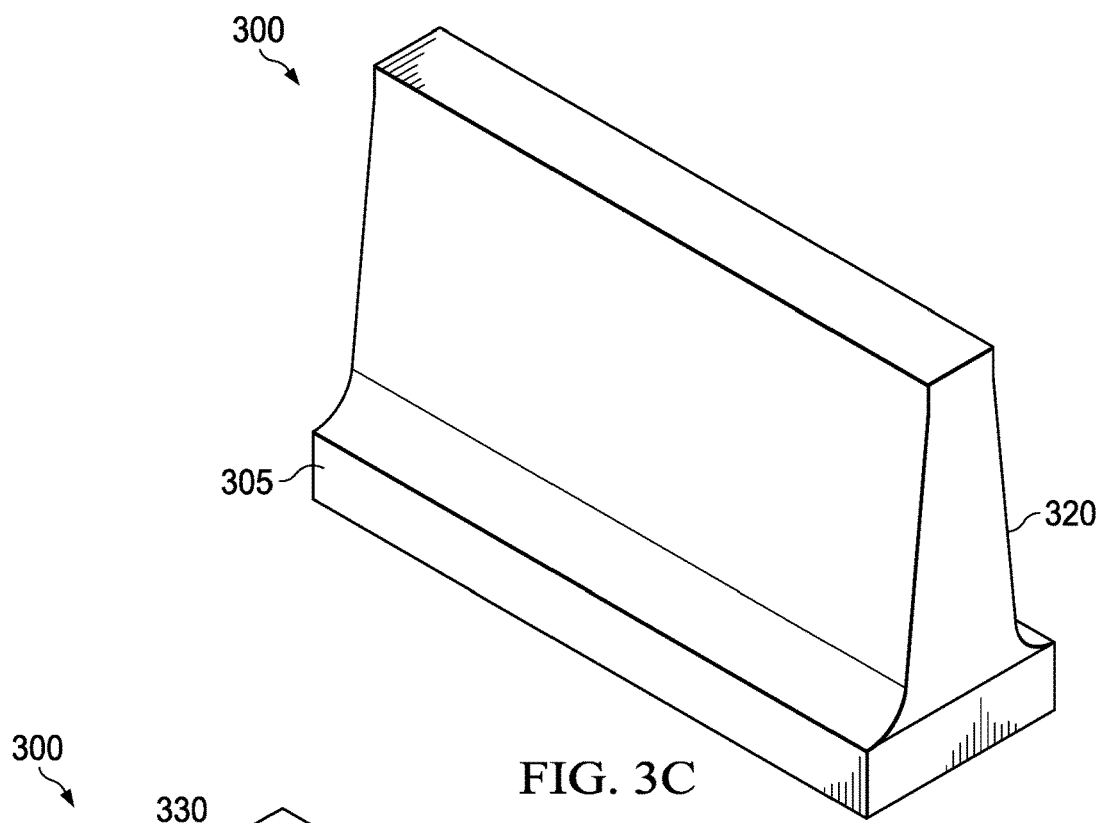

FIG. 3C depicts a perspective view of a single semiconductor fin 320 that provides further understanding of a fin. In FIG. 3C, the semiconductor fin 320 is formed over the substrate 305.

Figure 3D:
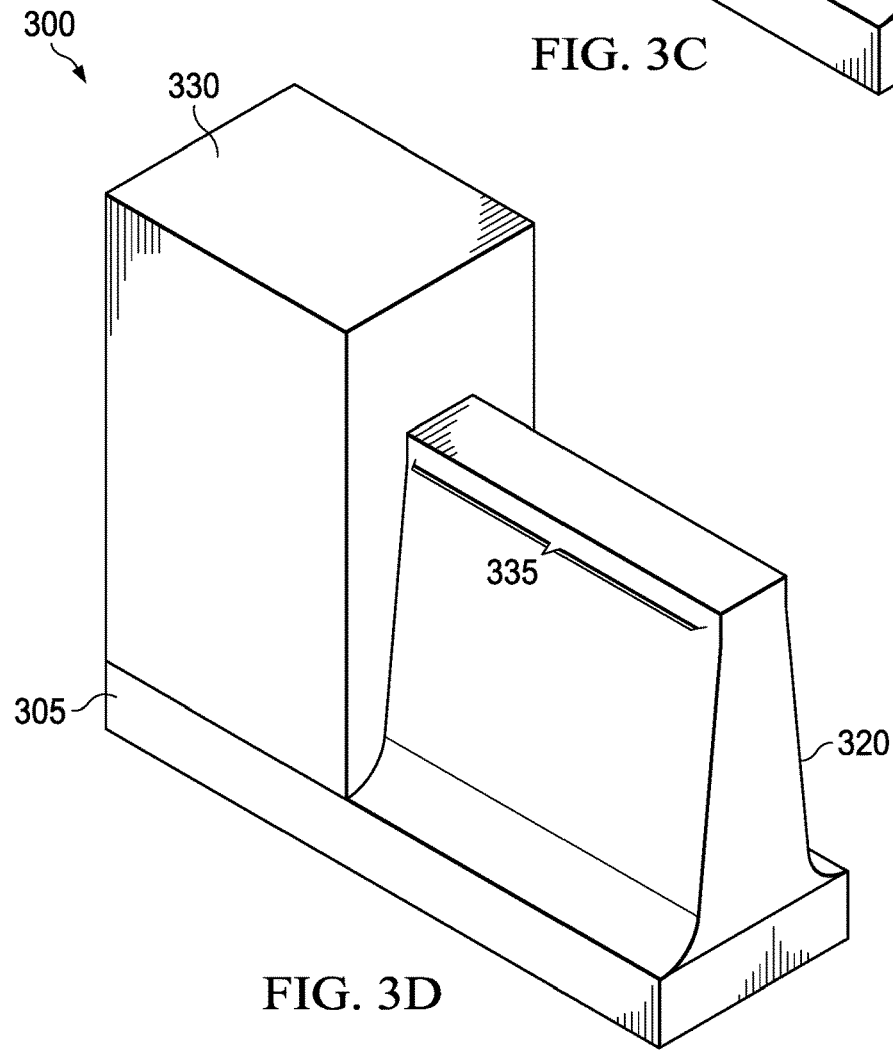

FIG. 3D depicts a perspective view of the semiconductor fin 320 in which a patterned photoresist 330 has been formed to expose a section 335 of the semiconductor fin 320. In one implementation, the exposed section 335 of the semiconductor fin 320 is destined to become the drift region for the FinFET semiconductor device.

Once the patterned photoresist 330 has been formed and patterned hardmask 310 has been removed, dopants can be implanted into the semiconductor fins 320 to create the appropriate doping levels for a drain drift region. At this point, baseline methods have been used including beamline implant, beamline rotational implant and plasma doping ("PLAD") methods. As described above, these methods result in a disadvantageous non-uniform doping profile of the semiconductor fin 320 when measured from its top surface down its sidewall to the bottom of the trench, as illustrated in FIGS. 1A, 1B and 2.

Figure 4A:
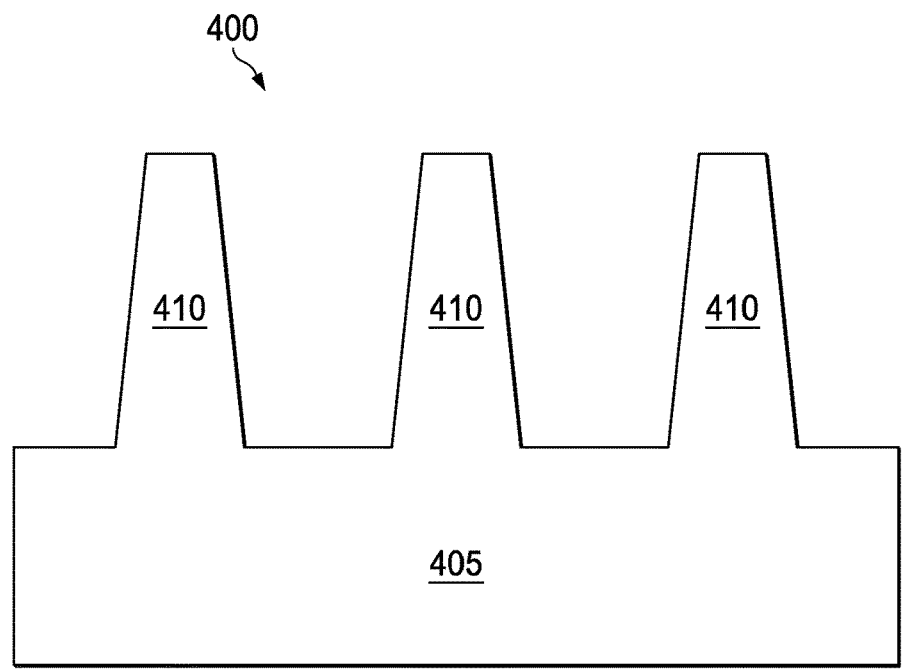
FIGS. 4A through 4F illustrate various views of the integrated circuit of FIGS. 3A-3D according to a method of doping fins of the FinFET semiconductor device.
Figure 4B:
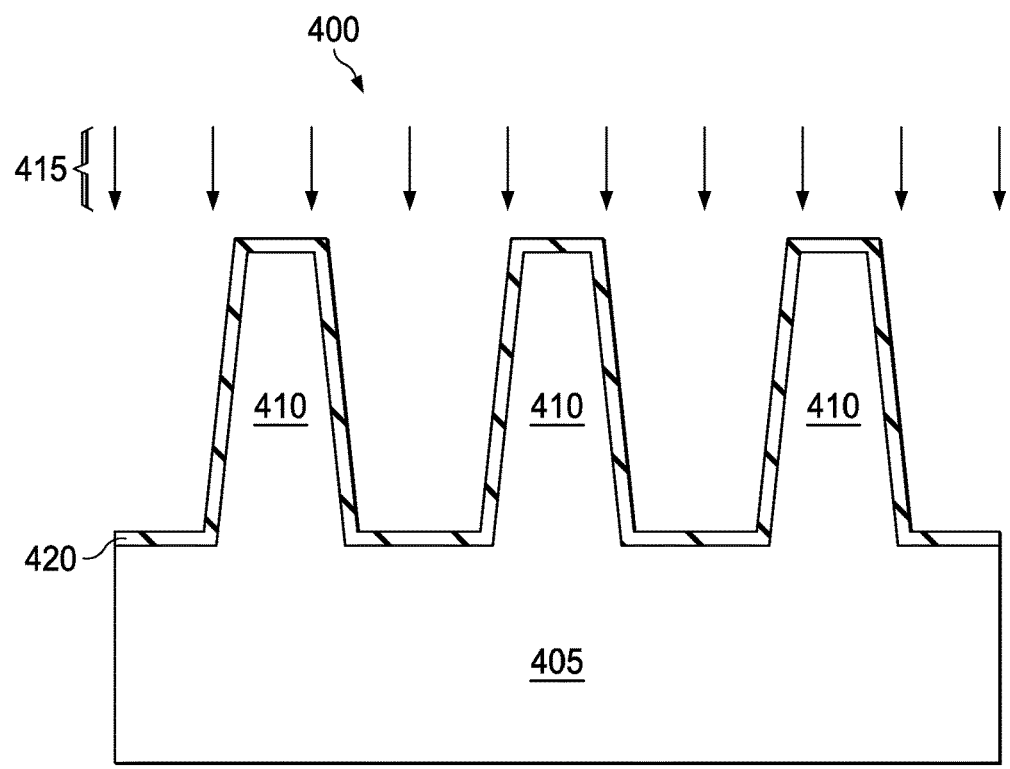
Figure 4C:
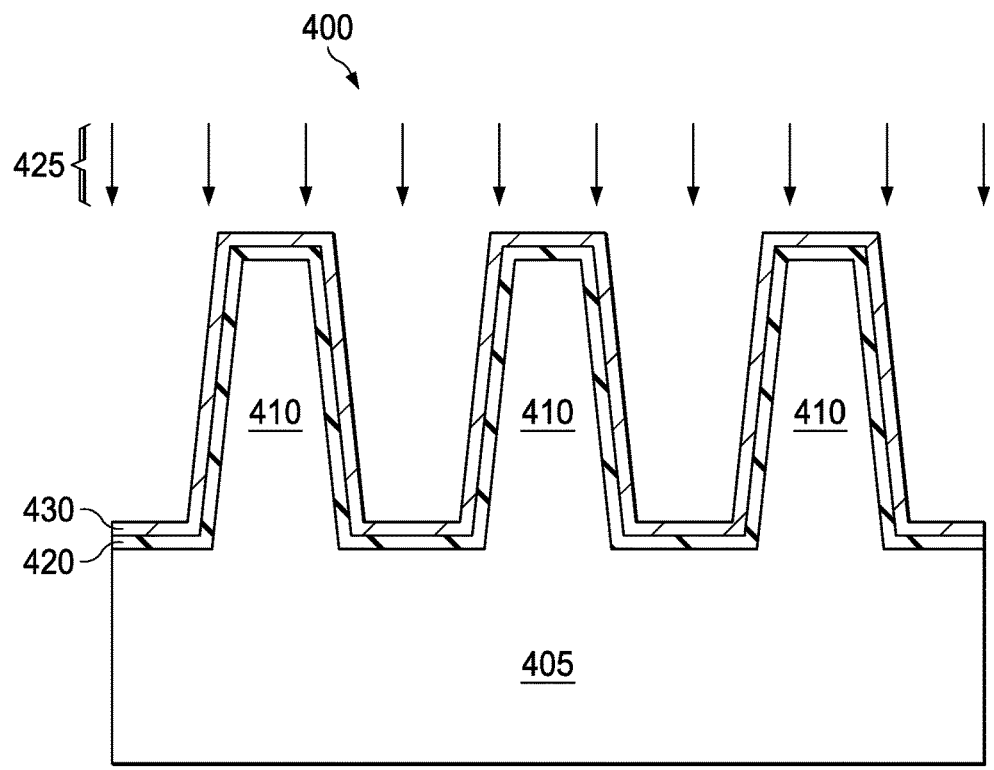
Figure 4D:
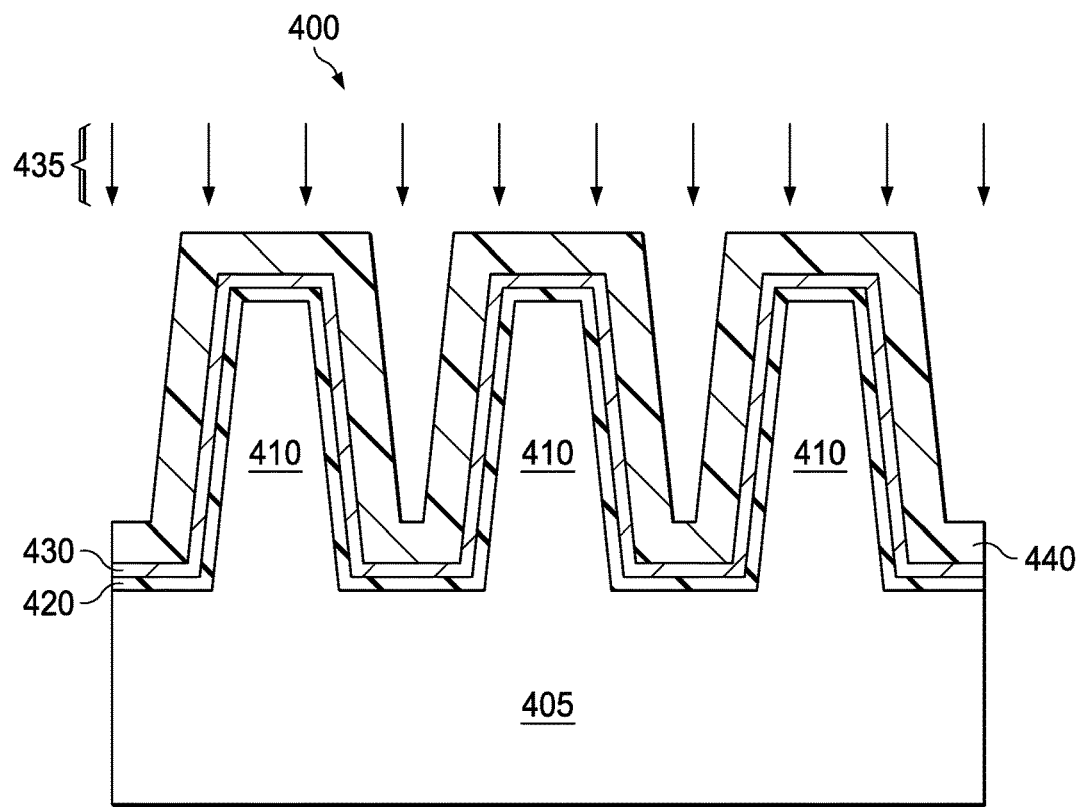
Figure 4E:
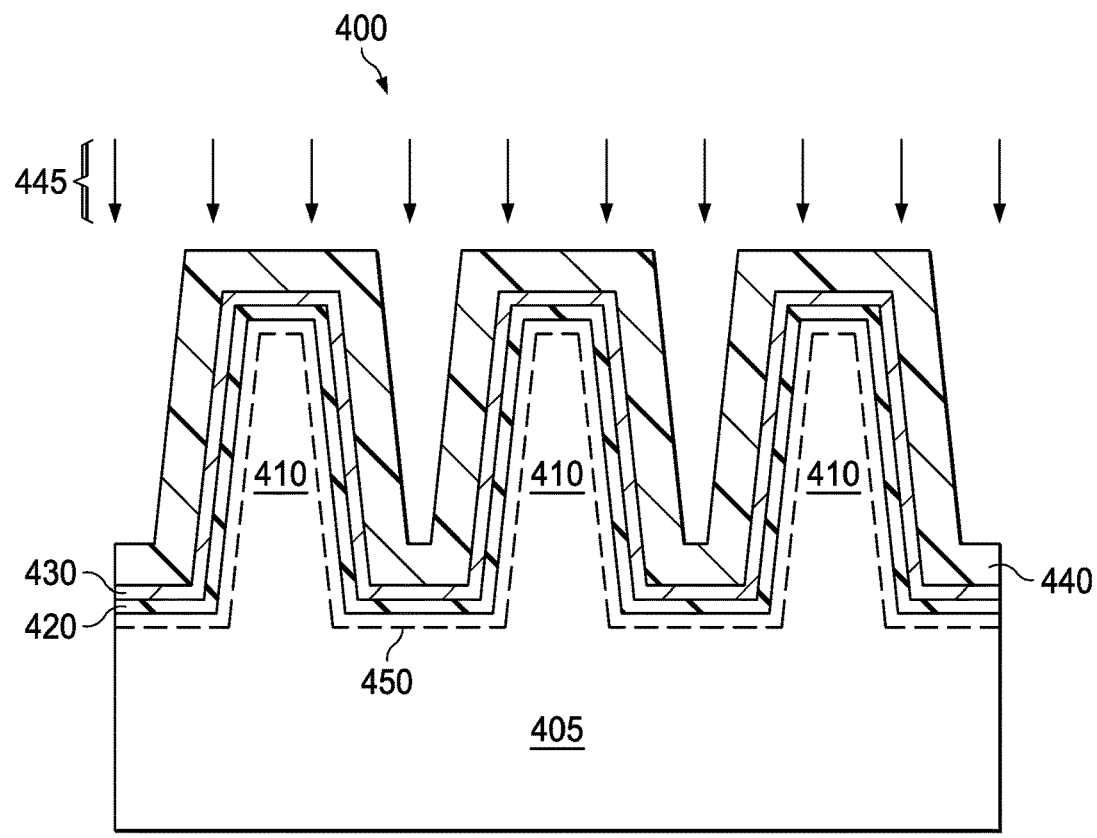
Figure 4F:
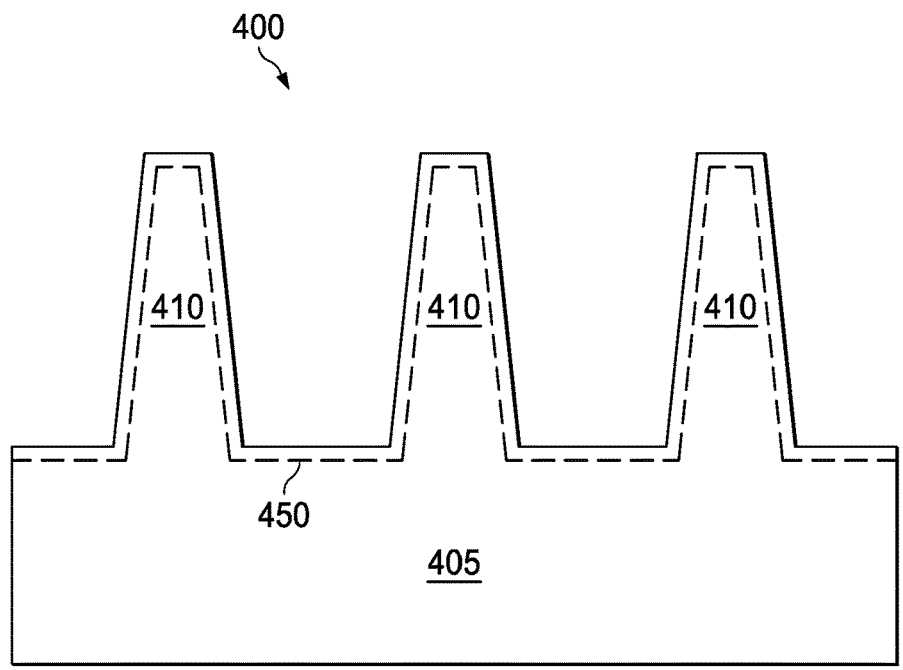
Figure 5:
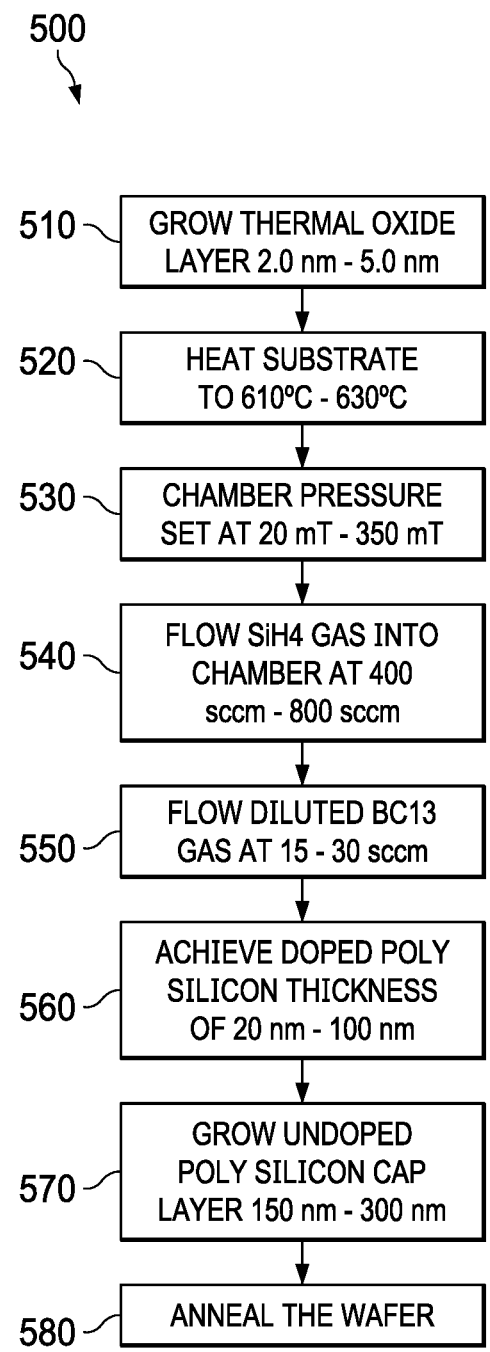
FIG. 5 illustrates a flow diagram of a method to be applied after reaching the sequence of steps illustrated in FIG. 3D.

FIGS. 4A-4F in conjunction with FIG. 5 illustrate a method of forming an integrated circuit, e.g. doping fins of a FinFET. FIGS. 4A-4F illustrate sectional views of an FinFET 400 that may be part of an IC at several intermediate stages of manufacturing, while FIG. 5 presents a method 500 with corresponding textual descriptions of process steps performed during the intermediate stages. The method 500 is expected to provide a more uniform dopant profile across the faces of the fin of the FinFET semiconductor device such as the fin 320 illustrated in FIGS. 3C and 3D. The method 500 relies on using a gas-phase doping process with in-situ boron doped polysilicon using low pressure chemical vapor deposition ("LPCVD") followed by growing an undoped polysilicon cap layer. Other dopants may be used such as phosphorus or arsenic. The description of FIGS. 4A-4F and FIG. 5 is presented with concurrent reference to both sets of figures.

FIG. 4A illustrates the FinFET 400 at the stage shown previously in FIG. 3D in a sectional view taken through the uncovered portion of fins 410 over a semiconductor substrate 405. In some examples, not shown, an isolation oxide layer may fill a portion of trenches between the fins 410 to electrically isolate the fins 410. In some examples, dimensions of the fins 410 are about 0.5 µm deep and about 0.6 µm wide, with a width of the fins 410 about 0.2 µm. In a process step not shown, the fins are subjected to a pre-furnace cleaning step ("PFC"), e.g., including a wet clean in dilute HF.

FIG. 4B shows the fins 410 during or after formation of a conformal dielectric layer such as an oxide layer 420 by an oxidation process 415. This figure corresponds to 510 of the method 500, in which the oxide layer 420 is thermally grown by the oxidation process 415, e.g., in a diffusion furnace, to a thickness of about 2.0 nm to about 5.0 nm. The oxide layer 420 is used as a hardmask to define the regions where doped polysilicon is to be grown over the fins 410. The oxide layer 420 may be formed in a furnace using a process, such as steam oxidation, that may be conventional or novel to a thickness of, for instance, about 2.0 nm to about 5.0 nm, or a target thickness of about 3.0 nm (30 Å). The target thickness is selected to be suitable for the dopant to be diffused into the fins 410, and may be different for different dopants. In the present example, a thickness of about 3.0 nm is expected to be suitable to result in a useful concentration of boron in the fins 410, e.g., at least 1e18 cm$^{-3}$. As shown in FIG. 4B the oxide layer 420 may cover all faces of the fins 410, e.g., top surface, sidewalls and bottom of the trench. In examples for which an isolation oxide layer is present at the bottom of the trenches, the oxide layer 420 may end at the isolation oxide layer.

FIG. 4C shows the FinFET 400 during or after formation of a doped semiconductor layer 430 by a process 425. The process 425 represents the result of multiple process actions, such as those depicted by 520-560 of the method 500. At 520, the substrate is heated to a temperature of about, for instance, 620° C. An example range of temperatures suitable for this step is 610° C. to 630° C. Then the LPCVD chamber pressure is set at 530 to, for instance, 250 mT (~33 Pa). An example range of pressures for this step is 200 mT (~27 Pa) to 350 mT (~47 Pa). Then a layer of doped polysilicon is grown by flowing silane gas ("SiH$_4$") at 540 using a mass flow rate of, for instance, 540 standard cubic centimeter per minute ("sccm") in addition to boron trichloride gas ("BCl$_3$") at a flow rate of, for instance, 20 sccm. The boron trichloride gas may be diluted with H$_2$ at 550 in a ratio of, for instance, 5% BCl$_3$-to-95% H$_2$. Optionally 0-300 sccm of N$_2$ may be flowed with the other gases. An example flow rate for a BCl$_3$ mixture is 15 sccm to 30 sccm. A doped polysilicon layer is grown at 560 until it reaches a thickness of, for instance, in a range from 20 nm to 100 nm, which in some examples may target 40 nm. While the example is shown using a dopant species of boron delivered via BCl$_3$ gas, other species may be used such as phosphorus or arsenic, with commensurate changes to the thickness of the oxide layer 420.

After the doped semiconductor layer 430 is completed, an optional air-break (not shown) may be performed after 560. An undoped polysilicon cap layer 440 (FIG. 4D) is grown at 570, e.g., by LPCVD, by a process 435 to a thickness in a range of 150 nm to 300 nm, for instance targeting 200 nm, using a process that may be conventional or novel. A similar process may be used as for the doped polysilicon layer with the exception of omitting the BCl$_3$ gas flow. While optional, the cap layer 440 may help prevent the dopant (e.g., boron, phosphorous and/or arsenic) from out-diffusing away from the fin 410 during subsequent thermal diffusion. The cap layer 440 may also prevent auto-doping within the wafer and provide for better wafer handling of dopant contamination.

After the growth of the cap layer 440 is completed, at 580 the wafer is placed in a furnace with a diffusion process 445 (FIG. 4E) including a temperature ranging from 900° C. to 1200° C. with duration ranging from about 20 minutes to about 50 minutes, for instance targeting 1000° C. for about 30 minutes. During the diffusion process, the oxide layer 420 is expected to control the dopant diffusion from the doped semiconductor layer 430 into the fin 410 at a rate determined in part by the thickness of the oxide layer 420. If the oxide layer 420 is too thin it risks dopant damage to the surface of the fin 410 and if too thick the rate of dopant diffusion may be diminished. The previously described range of oxide thickness may be advantageous to achieve a useful dopant concentration in the fin 410, e.g., 1e18 cm$^{-3}$.

Upon subsequent processing the oxide layer can be removed by a conventional or novel process, resulting the fins 410 having a doped region 450 (FIG. 4F) that may serve as any suitable doped region of the FinFET 400.

In one experimental example, a pilot device was formed with the oxide layer 420 having a thickness of about 3.0 nm, and the doped semiconductor layer 430 (doped polysilicon) having a thickness of about 30 nm and being in-situ doped with boron. The cap layer (undoped polysilicon) was formed with a thickness of about 200 nm. The pilot device was annealed for about 1000° C. for about 30 minutes. SIMS (secondary ion mass spectrometry) data of the resulting boron concentration indicated that the dopant concentration in the fin 410 was highly uniform, indicating that the dopant concentration at the sidewalls of the fins 410 is expected to be within about 80% of the dopant concentration at the top surface of the fins 410, though greater uniformity may be possible with further process refinement.

Figure 6B:
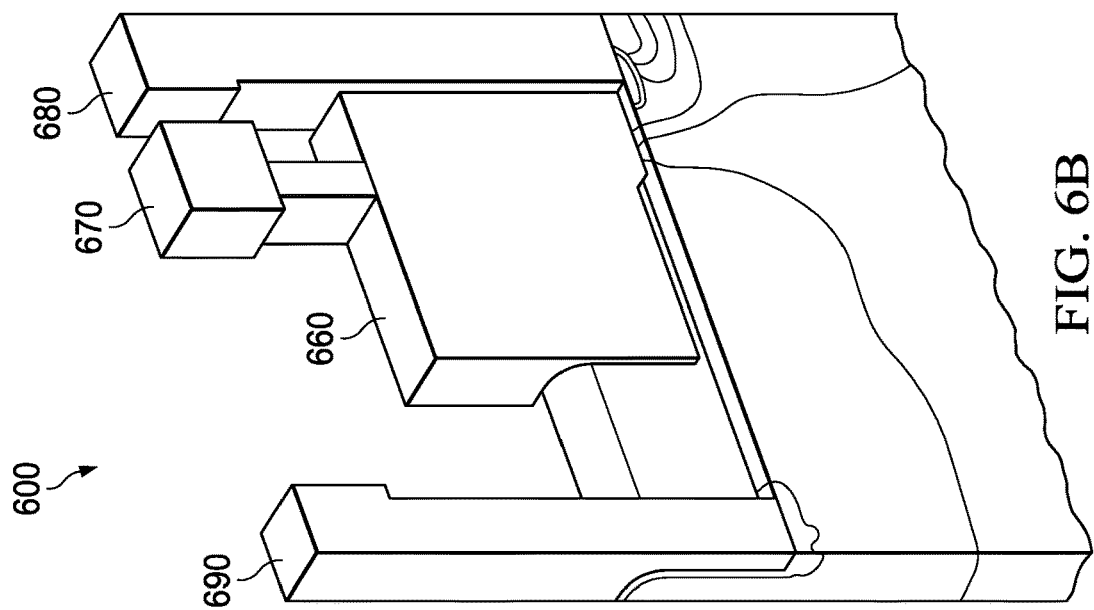
FIGS. 6A and 6B illustrate perspective views of a fin of a FinFET semiconductor device.
Figure 6A:
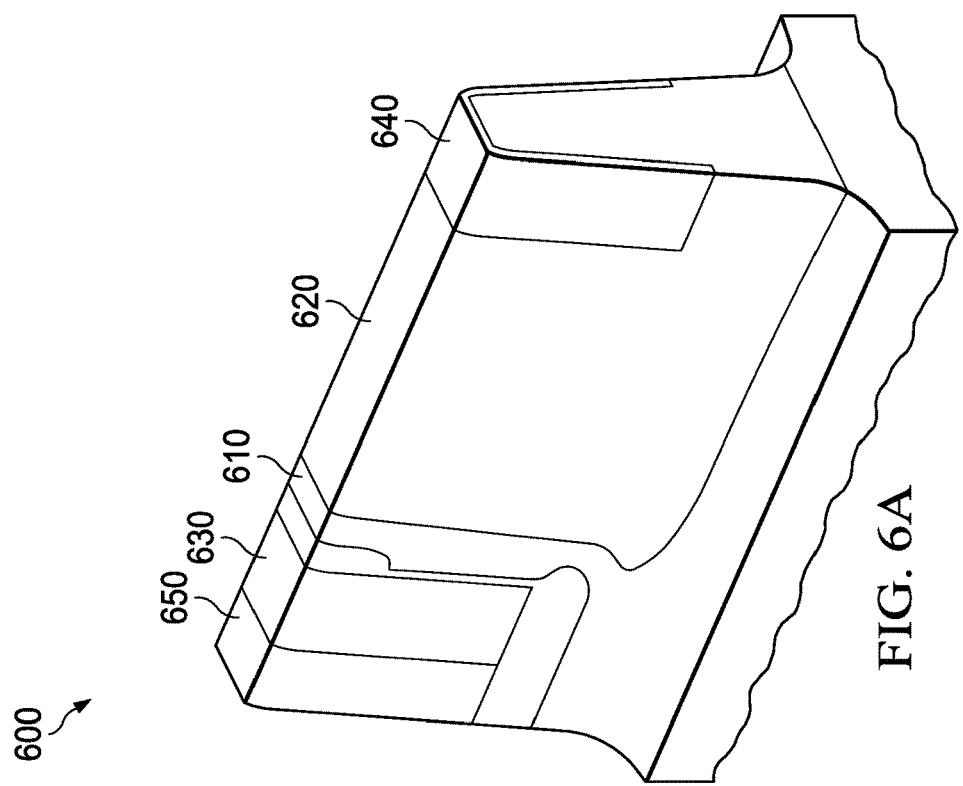

Turning now to FIGS. 6A and 6B, illustrated are perspective views of a fin 600 of a FinFET semiconductor device. Beginning with FIG. 6A, the fin 600 (e.g., a silicon-based fin) includes a well (e.g., an N-doped well) 610 adjacent to a drift region (e.g., an N-doped drift region) 620. The fin 600 also includes a source region (e.g., a heavily N-doped source region) 630, a drain region (e.g., a heavily N-doped drain region) 640 and a back gate region (e.g., a P-doped back gate region) 650. In addition to the regions mentioned above, FIG. 6B depicts a gate region (e.g., a P-doped gate region) 660 and gate contact 670. The fin 600 also includes a source contact 680 to the source region, and a drain contact 690 to the drain region. Any of the doped regions of the fin 600 may be doped according to the examples described herein Thus, a FinFET semiconductor device, and related method of forming the same, has been introduced. In one example (and with reference to representative reference numbers from the FIGURE(s) above, the semiconductor device (400) includes a fin (410) formed above a substrate (405), and a conformal dielectric layer such as a thermal oxide layer (420) formed (510) over a top surface and sidewalls of the fin (410). The thermal oxide layer (420) may also be formed at a bottom of a trench proximate the fin (410). The thermal oxide layer (420) may be in a range of 2.0 nm to 5.0 nm.

The semiconductor device (400) also includes a doped semiconductor layer or doped layer (430) formed (520-560) over the thermal oxide layer (420). The doped layer (430) may include at least one of boron, phosphorus and arsenic and be in a range of 20 nm to 100 nm. The thermal oxide layer (420) is also configured to control diffusion of dopant in the doped layer (430) into the fin (410). The doped layer (430) may be diffused into the fin (410) under control of the thermal oxide layer (420) by a thermal annealing process at 900° C. to 1200° C. for 20 to 50 minutes. Through the heating process, the dopant in the doped layer (430) is driven through the thermal oxide layer (420) thereby forming a doped region of the fin (410).

The semiconductor device (400) may also include a doped or undoped semiconductor layer (440) formed (570) over the doped layer (430). The undoped layer (440) may be an undoped polysilicon layer in a range of 150 nm to 300 nm. A doping density of the doped layer (430) at the top surface as compared to the sidewalls of the fin (410) is within 20 percent.

It should be understood that the previously described examples of the semiconductor device, and related methods, are submitted for illustrative purposes only and that other examples capable of controlling threshold voltage and gate leakage current are well within the broad scope of the present disclosure.

Although the present disclosure has been described in detail, various changes, substitutions and alterations may be made without departing from the spirit and scope of the disclosure in its broadest form.

Moreover, the scope of the present application is not intended to be limited to the particular examples of the process, machine, manufacture, composition of matter, means, methods and steps described in the specification. The processes, machines, manufacture, compositions of matter, means, methods, or steps, presently existing or later to be developed, that perform substantially the same function or achieve substantially the same result as the corresponding examples described herein may be utilized according to the present disclosure. Accordingly, the appended claims are intended to include within their scope such processes, machines, manufacture, compositions of matter, means, methods, or steps.

What is claimed:

1. A method of forming an integrated circuit, comprising:
   forming a semiconductor fin over a semiconductor substrate;
   forming a conformal dielectric layer on a top and side surfaces of the fin;
   forming a doped semiconductor layer over the conformal dielectric layer, the doped semiconductor layer including a dopant;
   heating the doped semiconductor layer thereby driving the dopant through the conformal dielectric layer thereby forming a doped region of the fin; and
   forming an undoped semiconductor layer over the doped semiconductor layer and then annealing the doped and undoped semiconductor layers.

2. The method as recited in claim 1, wherein the conformal dielectric layer is a thermal oxide layer.

3. The method as recited in claim 1, wherein the doped semiconductor layer includes polysilicon.

4. The method as recited in claim 1, wherein the dopant includes boron.

5. The method as recited in claim 1, wherein the conformal dielectric layer has a thickness of about 3.0 nm.

6. The method as recited in claim 1, wherein the doped semiconductor layer has a thickness of about 40 nm.

7. The method as recited in claim 1, wherein the doped and undoped semiconductor layers are formed in a furnace, and further comprising performing an air break between the forming the doped semiconductor layer and the undoped semiconductor layer.

8. The method as recited in claim 1, wherein the doped semiconductor layer has an as-formed dopant concentration of about 1e18 $cm^{-3}$.

9. The method as recited in claim 1, wherein the doped region is a drift region of a metal-oxide semiconductor (MOS) Fin field-effect transistor (FinFET).

10. A method of forming a semiconductor device, comprising:
    forming a fin above a substrate;
    forming a thermal oxide layer over a top surface and sidewalls of the fin;
    forming a doped layer over the thermal oxide layer, the thermal oxide layer being configured to control a dopant diffusion of the doped layer into the fin; and
    forming an undoped polysilicon layer over the doped layer, wherein a dopant in the doped layer is diffused into the fin through the thermal oxide layer by a thermal annealing process at 900° C. to 1200° C. for 20 to 50 minutes.

11. The method as recited in claim 10 wherein the undoped polysilicon layer has a thickness in a range of 150 nm to 300 nm.

12. The method as recited in claim 10 wherein the thermal oxide layer is in a range of 2.0 to 5.0 nm.

13. The method as recited in claim 10 wherein the doped layer is in a range of 20 nm to 100 nm.

14. The method as recited in claim 10 wherein the doped layer comprises at least one of boron, phosphorus and arsenic.

15. The method as recited in claim 10 further comprising forming the thermal oxide layer at a bottom of a trench proximate the fin and forming the doped layer thereover.

16. The method as recited in claim 10 wherein a doping density of the doped layer at the top surface as compared to the sidewalls is within 20 percent.

17. A method of forming a semiconductor device, comprising:
    forming a fin above a substrate;
    forming a thermal oxide layer over a top surface and sidewalls of the fin;
    forming a doped layer over the thermal oxide layer, the thermal oxide layer being configured to control a dopant diffusion of the doped layer into the fin; and
    forming an undoped polysilicon layer over the doped layer,
    wherein a doping density of the doped layer at the top surface as compared to the sidewalls is within 20 percent.

* * * * *